United States Patent
Göbl et al.

(10) Patent No.: US 7,626,256 B2
(45) Date of Patent: Dec. 1, 2009

(54) COMPACT POWER SEMICONDUCTOR MODULE HAVING A CONNECTING DEVICE

(75) Inventors: Christian Göbl, Nürnberg (DE); Markus Knebel, Tuchenbach (DE)

(73) Assignee: SEMIKRON Elektronik GmbH & Co. KG, Nürnberg (DE)

( * ) Notice: Subject to any disclaimer, the term of this patent is extended or adjusted under 35 U.S.C. 154(b) by 281 days.

(21) Appl. No.: 11/726,641

(22) Filed: Mar. 22, 2007

(65) Prior Publication Data

US 2007/0222060 A1 Sep. 27, 2007

(30) Foreign Application Priority Data

Mar. 22, 2006 (DE) .................. 10 2006 013 078

(51) Int. Cl.
*H01L 23/48* (2006.01)

(52) U.S. Cl. .................. 257/691; 257/678; 257/690; 257/773; 257/E23.001; 257/E23.153

(58) Field of Classification Search ......... 257/678–733, 257/E23.001–E23.194
See application file for complete search history.

(56) References Cited

U.S. PATENT DOCUMENTS

| | | | |
|---|---|---|---|
| 4,939,570 A | | 7/1990 | Bickford et al. |
| 5,105,536 A | | 4/1992 | Neugebauer et al. |
| 5,639,990 A | | 6/1997 | Nishihara et al. |
| 6,060,772 A | * | 5/2000 | Sugawara et al. ........... 257/678 |
| 7,042,074 B2 | * | 5/2006 | Gobl et al. .................. 257/678 |
| 2005/0127503 A1 | | 6/2005 | Gobl et al. |
| 2006/0126312 A1 | | 6/2006 | Kroneder |

FOREIGN PATENT DOCUMENTS

| | | |
|---|---|---|
| DE | 41 30 637 | 4/1992 |
| DE | 102 58 570 | 7/2004 |
| DE | 103 55 925 | 6/2005 |
| DE | 2004 025 609 | 12/2005 |
| DE | 10 2006 013 078 | 10/2007 |
| EP | 1 255 299 | 11/2002 |
| JP | 07221264 | 8/1995 |

\* cited by examiner

*Primary Examiner*—Jasmine J Clark
(74) *Attorney, Agent, or Firm*—Cohen Pontani Lieberman & Pavane LLP

(57) ABSTRACT

A power semiconductor module having a housing, a substrate with conductor tracks and power semiconductor components arranged on the conductor tracks, and a connecting device. The connecting device comprises a film composite with first and second conductive layers, which are respectively patterned and thus form conductor tracks, and an insulating layer disposed between the two conductive layers. The first conductive layer has first contacts, formed as spot-welded joints, for power connecting areas of power semiconductor components, second contacts for control connecting areas of power semiconductor components and third contacts for the load connection to a printed circuit board. The second conductive layer connects to the first conductive layer and fourth contacts for providing control connection to an external printed circuit board. The film composite also has film sections between the first and second contacts and between the third and fourth contacts, which are arranged in guide sections of the housing.

13 Claims, 4 Drawing Sheets

COMPACT POWER SEMICONDUCTOR MODULE HAVING A CONNECTING DEVICE

BACKGROUND OF THE INVENTION

1. Field of the Invention

The invention is directed to a compact power semiconductor module having a connecting device for electrically connecting the load and control terminals of power semiconductor components within the module to an external printed circuit board.

In this application, the term "load connection" is intended to mean a connection between a contact of the power semiconductor module and an external line element, meaning the load terminals, such as, for example, the DC inputs of an intermediate circuit and an AC output in a half-bridge circuit.

In a similar manner, the term "control connection" is intended to mean the connection between an auxiliary or control terminal of the power semiconductor module and an external control terminal element.

2. Description of the Related Art

Known power semiconductor modules are disclosed, for example, in German Patent Application Nos. DE 10 2004 025 609 A1 and DE 103 55 925 A1. German Patent Application No. 10 2004 025 609 A1 discloses a power semiconductor module with screw pressure contacts. According to the prior art, the load connection between the power semiconductor module and an external printed circuit board is established by a screw connection. In this case, the control connections of the auxiliary or control terminals are established by connecting a spring contact element with a conductor track section of the printed circuit board. According to this reference, pressure is introduced into the control connection by means of the arrangement and screw connection of the printed circuit board to the load terminal elements. The configuration of a power semiconductor module of this type is particularly suitable for current loads in excess of 10 amperes.

German Published Application No. DE 103 55 925 A1 discloses a connecting device for power semiconductor components comprising a film composite of a first and a second conductive film with an insulating intermediate layer therebetween. The power semiconductor components are permanently electrically connected to the first conductive layer by ultrasonic welding. This application discloses a connection of the power semiconductor components within the module, which is suitable for the circuit and comprises both the load and control terminals. However, this application does not disclose any details of either the load or control connections for establishing connections to circuits outside of the module.

SUMMARY OF THE INVENTION

It is an object of the invention to present a power semiconductor module having a connecting device formed as a film composite.

It is another object of the invention to provide a power semiconductor module that is both simple to produce and compact, and in which both the load terminals and the control terminals connect to a printed circuit board.

Briefly started, the invention is a power semiconductor module having a housing and at least one substrate with conductor tracks and power semiconductor components which are arranged on the conductor tracks. The power semiconductor module also has at least one connecting device which is formed as a film composite having first and second conductive layers with an insulating layer disposed therebetween.

The respective conductive layers are patterned per se and thus form conductor tracks. It is preferred for individual conductor tracks of the two conductive layers to be connected to one another by means of a connection which is suitable for the circuit, for example, in the form of pressure contact connections.

The first conductive layer of the film composite has first contacts, preferably in the form of spot-welded joints, for power connecting areas of power semiconductor components. This first conductive layer also preferably has second contacts for control connecting areas of power semiconductor components on a further conductor track. The first conductive layer has third contacts for the load connection to a printed circuit board. The second conductive layer has fourth contacts for the control connection to the printed circuit board.

The film composite has film sections between the first and second contacts and between the third and fourth contacts, which are arranged in guide sections of the housing, the third and fourth contacts having parallel area normals.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1A:
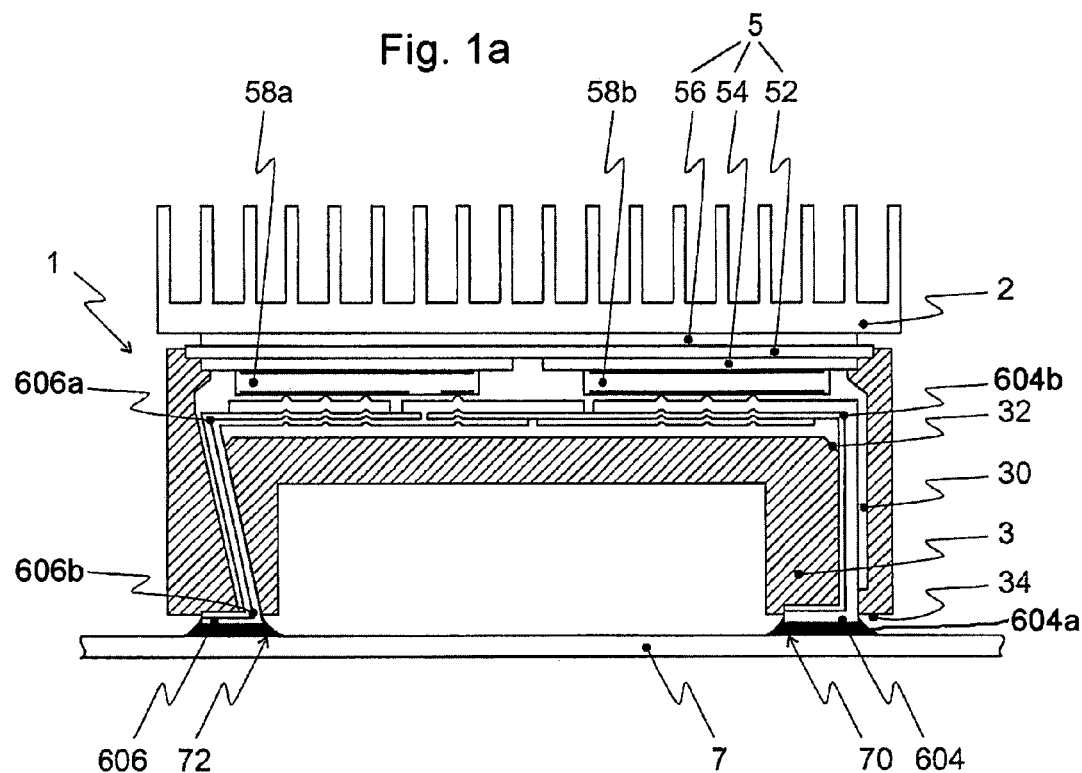
FIG. 1a shows, in section, a first embodiment of a power semiconductor module in accordance with the invention.

FIG. 1a shows, in section, a first embodiment of an inventive power semiconductor module 1 in an arrangement with a heat sink 2 and a printed circuit board 7. Power semiconductor module 1 comprises a housing 3 which surrounds a substrate 5 such that substrate 5 partially projects beyond that side of the housing 3 which faces away from the inside of power semiconductor module 1. Heat sink 2 is arranged on this side of electrically insulating substrate 5 and is thermally conductively connected to substrate 5.

That side of substrate 5 which faces the inside of power semiconductor module 1 is formed as a plurality of conductor tracks 54 which are electrically insulated from one another. A plurality of power semiconductor components 58 a/b are arranged on conductor tracks 54 in a manner suitable for the circuit and are electrically conductively connected.

Figure 1B:
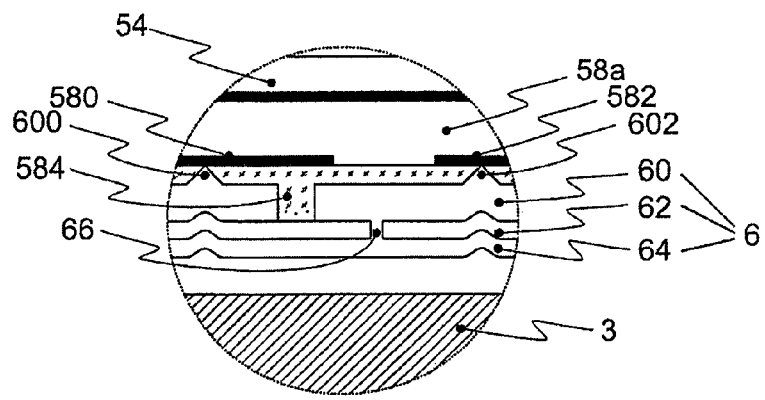
FIG. 1b shows a detail of the power semiconductor module of FIG. 1.

Power semiconductor module 1 also has a connecting device 6 (FIG. 1b) which comprises a film composite. This film composite is formed from a first conductive layer 60 and a second 64 conductive layer, which are respectively patterned per se and thus form conductor tracks, and an insulating layer 62 which is disposed between first and second conductive layers 60, 64.

First conductive layer 60 has first contacts 600, preferably formed as spot-welded joints, for power connecting areas 580 of power semiconductor components 58$a/b$. It also has second contacts 602 for control connecting areas 582 of power semiconductor components 58$a$. First conductive layer 60 and its conductor tracks 54, with contacts 600, 602, thus form the connection—which is suitable for the circuit—of connecting areas 580, 582 of power semiconductor components 58$a/b$ which face away from substrate 5. The volume between substrate 5 and first conductive layer 60 is filled with an insulating material 584. For reasons of electrical safety, this insulating material preferably is a silicone gel or an epoxy resin.

First conductive layer 60 furthermore has third contacts 604 for a load connection 70 to a printed circuit board 7. Third contacts 604 are electrically conductively connected to first contacts 60 and thus to the load connecting areas of the associated power semiconductor component 58$a/b$.

Second conductive layer 64 has a connection 66—which is suitable for the circuit—to first conductive layer 60 in order, for example, to connect control connecting areas 582 of power semiconductor components 58$a$ to fourth contacts 606 to establish a control connection 72 to a printed circuit board 7.

It is preferred for third and fourth contacts 604, 606 to be respectively arranged in a row. To this end, power semiconductor module 1 has guide sections 30 inside housing 3, in which film sections of the film composite are arranged. These film sections form the connection between first and second contacts 600, 602 and between third and fourth contacts 604, 606.

In order to form this configuration of the power semiconductor module, the film section for third contacts 604 has a first bending point 604$a$ and a second bending point 604$b$ with the same bending direction. In contrast, the film section for fourth contacts 606 has a first bending point 606$a$ with a first bending direction and, farther along, a second bending point 606$b$ with an opposite second bending direction. In this case, bending points 604$a/b$; 606$a/b$ are arranged on associated edges 32 of guide sections 30 of housing 3.

As a result of this configuration, both third and fourth contacts 604, 606 are arranged in a plane determined by printed circuit board 7 with which contact is to be made. Third and fourth contacts 604, 606 thus likewise form areas with parallel area normals. Housing 3 is configured so that third contacts 604 and fourth contacts 606 project beyond housing 3 in the direction of their area normals, and a soldered connection to printed circuit board 7 is thus made possible.

Figure 2A:
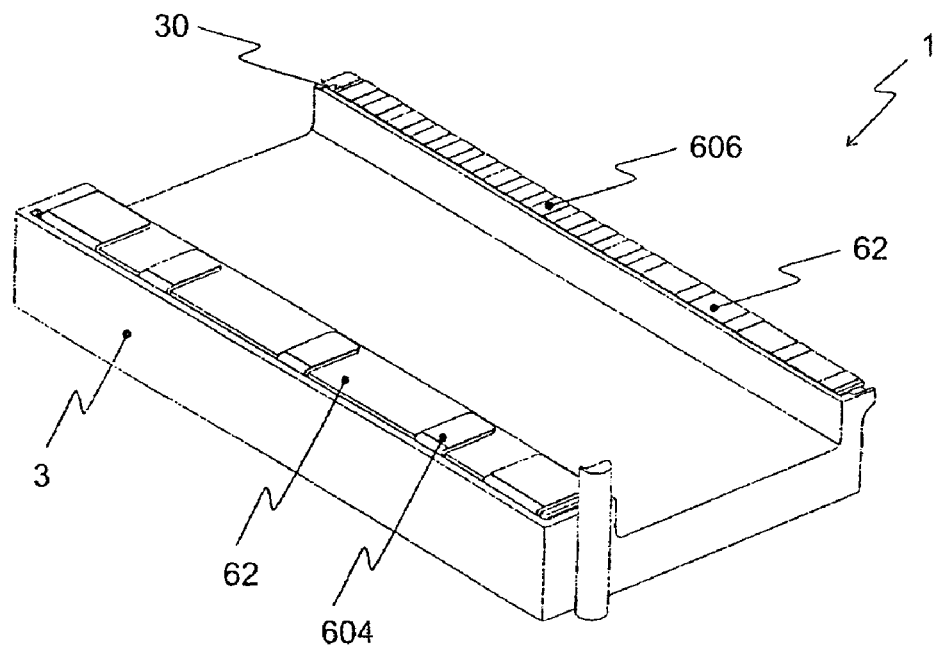
FIGS. 2a/b show perspective views of the embodiment of the power semiconductor module of FIG. 1.
Figure 2B:
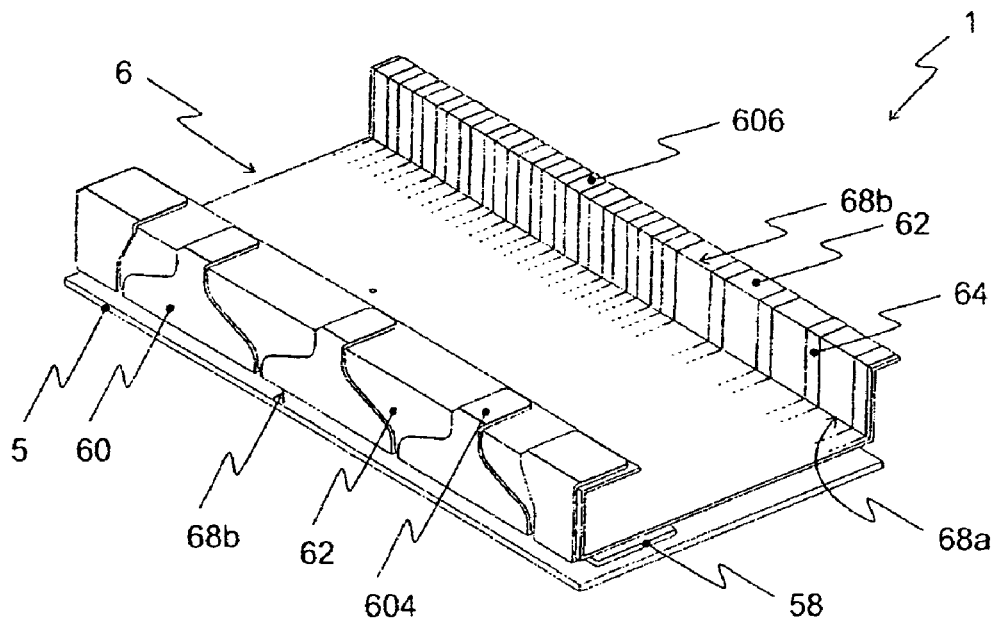

FIGS. 2$a/b$ show a three-dimensional view of the first embodiment of power semiconductor module 1, with housing 3 shown in FIG. 2$a$, and with housing 3 omitted in FIG. 2$b$. Substrate 5, with power semiconductor components 58, is shown in FIG. 2$b$. Power semiconductor components 58 are connected, in a manner suitable for the circuit, by means of a connecting device 6 (FIG. 1$a$) which comprises a first conductive film layer 60 that is patterned per se and forms conductor tracks. Furthermore, connecting device 6 comprises an insulating film layer 62 and a further film layer 64 which is arranged on insulating film layer 62, which is likewise patterned per se and forms conductor tracks. Only the respective profile of the conductor tracks on second film layer 64 is shown in FIG. 2$b$.

Film sections of connecting device 6 with conductor tracks formed thereon reach through guide sections 30 of housing 3 (FIG. 1$a$) and are arranged on that side of housing 3 which faces away from substrate 5 in such a manner that contacts 604, 606 for the load and control connection to a printed circuit board form a plane and have parallel area normals.

To this end, as shown in the cross-section of FIG. 1$a$, the film section for third contacts 604 has first and second bending points 604$a/b$ with the same bending direction, whereas the film section for fourth contacts 606 has first and second bending points 606$a/b$ with opposite bending directions.

According to the invention, the respective third contacts 604 are formed as partial sections of conductor tracks of the first conductive layer 60, and fourth contacts 606 are formed as partial sections of conductor tracks of second conductive layer 64.

Figure 3:
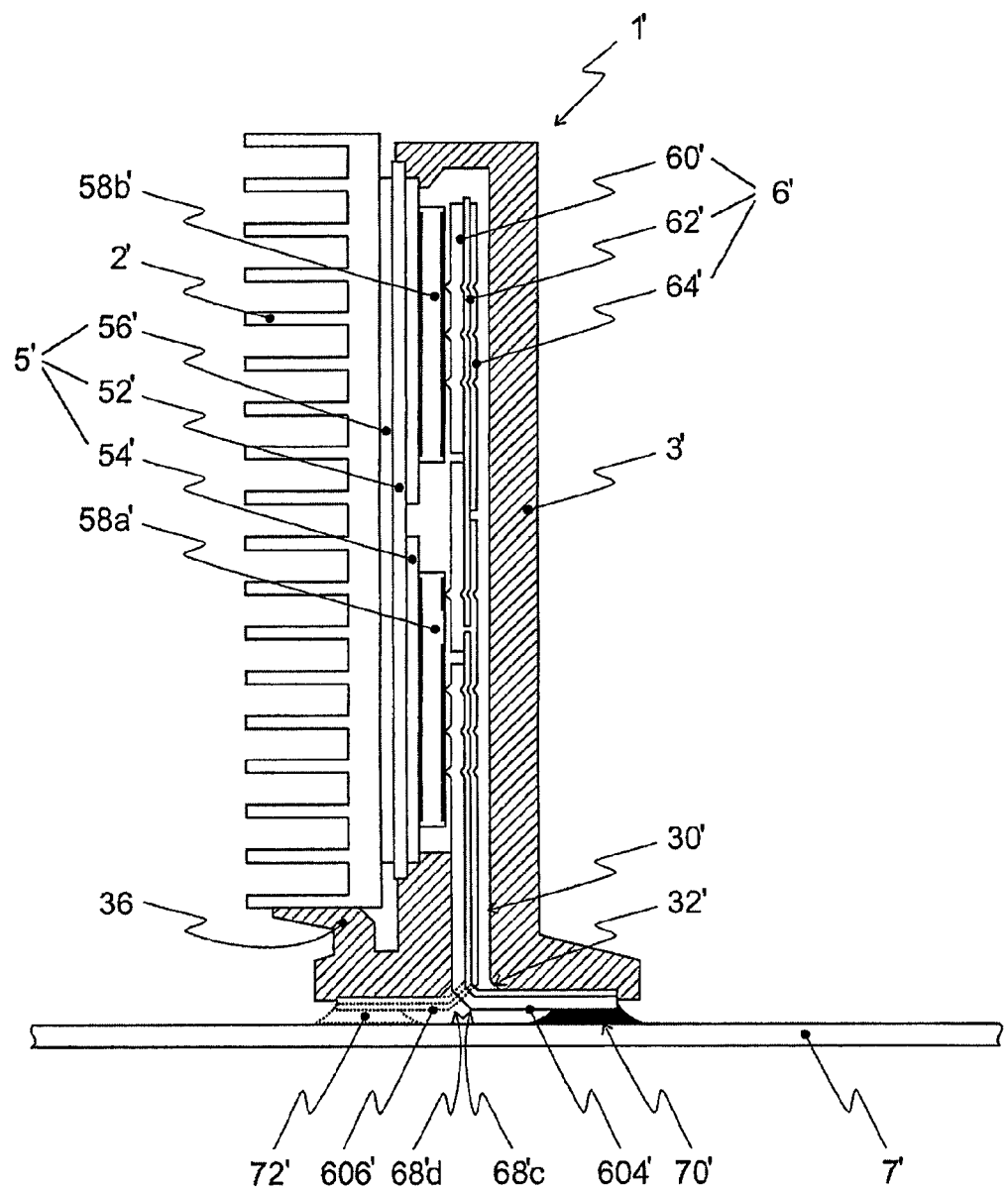
FIG. 3 shows, in section, a second embodiment of a power semiconductor module in accordance with the invention.

FIG. 3 shows, in section, a second embodiment of an inventive power semiconductor module 1' in an arrangement with a heat sink 2' and a printed circuit board 7'. The configuration of the substrate 5' with the arranged heat sink 2' and power semiconductor components 58$a'/b'$ corresponds to that shown in FIG. 1, heat sink 2' being supported in this case on a special shaped portion 36 of housing 3'. Connecting device 6' likewise comprises the film composite (already described) of first and second conductive layers 60', 64' and an insulating layer 62' arranged therebetween. First and second contacts 600', 602' for connecting areas 580', 582' of power semiconductor components 58$a'/b'$ are preferably formed as spot-welded joints.

Housing 3' surrounds substrate 5' and has a guide section 30' for arranging a film section between first and second contacts 600', 602' and between third and fourth contacts 604', 606' for the purpose of making contact with a printed circuit board 7'. This film section for third contact devices 604' has a bending point 68$c'$ with a first bending direction, and the film section for fourth contacts 606' has a second bending point 68$d'$ with a second bending direction. This again results in third contacts 604' and fourth contacts 606' being arranged in a plane, which is, however, perpendicular to the plane of the substrate in this case, and the area normals of the contact devices 604', 606' again being substantially parallel. The detailed configuration of the connecting device is illustrated in FIG. 4.

Figure 4A:
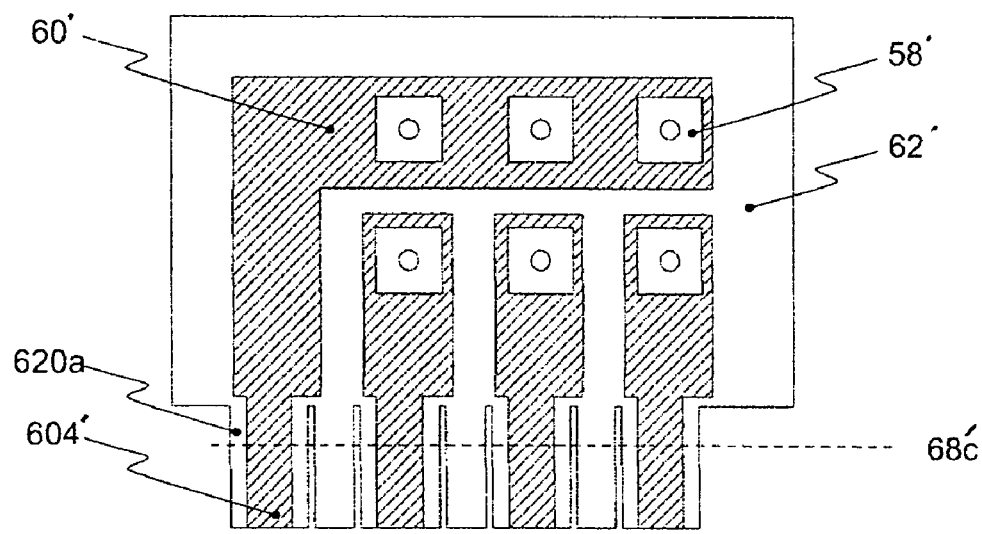
FIG. 4 shows the film composite of the embodiment of FIG. 3.

FIG. 4 shows the film composite (with indicated power semiconductor components 58, for example MOSFETs) of the connecting device according to the second embodiment of inventive power semiconductor module 1' shown in FIG. 3. In FIG. 4$a$, a load connection side is formed by first conductive layer 60' and insulating layer 62' of the film composite. Insulating layer 62' is in the form of an area having lugs 620$a$ which are formed integrally with the area. Lugs 620$a$ form, together with conductor tracks of the first film layer, first film sections for arrangement in a guide shaft of the power semiconductor module. In this case, parts of the conductor tracks form third contacts 604' shown in FIG. 3. In order to form the perpendicular arrangement of third contacts 604' relative to the plane of substrate 5' (FIG. 3), the film composite has a first bending point shown as dashed line 68$c'$ in FIG. 4$a$.

Figure 4B:
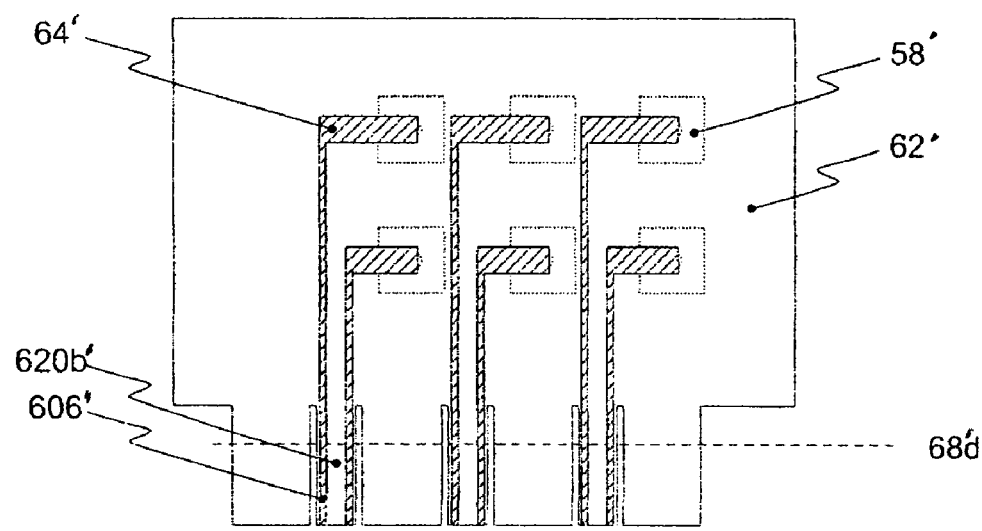

FIG. 4$b$ illustrates a control connection side from the same viewing direction as in FIG. 2$a$. This control connection side is formed by second conductive layer 64' and insulating layer 62' of the film composite. Insulating layer 62' is, in turn, formed as an area having lugs 620$b$ which are integrally formed with the area. Lugs 620$b$ form, together with conductor tracks of the second film layer, second film sections for arrangement in a guide shaft of the power semiconductor module. In this case, parts of the conductor tracks form fourth contacts 606' shown in FIG. 3. In order to form the perpendicular arrangement of these contact devices 604' relative to the plane of the substrate, the film composite has a second bending point shown as dashed line 68d' in FIG. 4b.

As a result of the different bending directions of first bending point 68c and second bending point 68d', contacts 604', 606' are formed on a plane with respective substantially parallel area normals, as illustrated in FIG. 3.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a housing having guide sections;
   at least one substrate disposed within said housing, said substrate having first conductor tracks and power semiconductor components disposed on said first conductor tracks; and
   a connecting device formed of a film composite having first and second patterned conductive layers which form second conductor tracks, and an insulating layer disposed between said first and second conductive layers;
   wherein said first conductive layer has
   a first plurality of first contacts, to connect to power connecting areas of said power semiconductor components;
   a second plurality of second contacts, to connect to control connecting areas of said power semiconductor components; and
   a third plurality of third contacts to provide a load connection to a printed circuit board;
   wherein said second conductive layer is connected to said first conductive layer and has a fourth plurality of fourth contacts to provide a control connection to said printed circuit board;
   wherein said film composite has a first film section disposed between said first and second contacts and a second film section disposed between said third and fourth contacts, said first and second film sections being arranged in said guide sections of said housing; and
   wherein said third and fourth contacts have substantially parallel area normals.

2. The power semiconductor module according to claim 1, further comprising:
   a third film section for said plurality of third contacts, each of said third contacts having a first bending point which bends in a first bending direction and a second bending point which also bends in said first bending direction; and
   a fourth film section for said plurality of fourth contacts, each of said fourth contacts having a third bending point with a second bending direction and a fourth bending point which bends in a third bending direction opposite to said second bending direction.

3. The power semiconductor module according to claim 2, wherein at least one of said first, second, third and fourth bending points are disposed on edges of said guide sections of said housing.

4. The power semiconductor module according to claim 2, wherein
   said third contacts and said fourth contacts are arranged in a plane substantially parallel to the plane of said substrate.

5. The power semiconductor module according to claim 2, wherein one of said second and third directions is substantially parallel to said first direction.

6. The power semiconductor module according to claim 1, further comprising:
   a third film section for said plurality of third contacts, each of said third contacts having a first bending point which bends in a first bending direction; and
   a fourth film section for said plurality of fourth contacts, each of said fourth contacts having a second bending point which bends in a second bending direction.

7. The power semiconductor module according to claim 6, wherein at least one of said first and second bending points is disposed on edges of said guide sections of said housing.

8. The power semiconductor module according to claim 6 wherein:
   said substrate lies in a plane; and
   said third contacts and said fourth contacts are disposed in a plane substantially perpendicular to said plane of said substrate.

9. The power semiconductor module according to claim 1, wherein
   said third contacts are formed in partial sections of said second conductor tracks of said first conductive layer; and
   said fourth contacts are formed as partial sections of said second conductor tracks of said second conductive layer.

10. The power semiconductor module according to claim 1, wherein
    said third contacts and said fourth contacts extend beyond said housing in the direction of their respective area normals.

11. The power semiconductor module according to claim 1, wherein the volume between said substrate and said first conductive layer is filled with an insulating material.

12. The power semiconductor module according to claim 11, wherein said insulating material is at least one of a silicone gel and an epoxy resin.

13. The power semiconductor module according to claim 1, wherein said first contacts are formed as spot-welded joints.

* * * * *